(12) United States Patent
Zhang et al.

(10) Patent No.: US 12,080,950 B2
(45) Date of Patent: Sep. 3, 2024

(54) CIRCUIT AND METHOD FOR REDUCING ANTENNA SAR

(71) Applicant: HUAQIN TECHNOLOGY CO., LTD., Shanghai (CN)

(72) Inventors: Jie Zhang, Shanghai (CN); Xiaowu Luo, Shanghai (CN)

(73) Assignee: HUAQIN TECHNOLOGY CO., LTD., Shanghai (CN)

( * ) Notice: Subject to any disclaimer, the term of this patent is extended or adjusted under 35 U.S.C. 154(b) by 158 days.

(21) Appl. No.: 17/785,390

(22) PCT Filed: Dec. 31, 2020

(86) PCT No.: PCT/CN2020/142485
§ 371 (c)(1),
(2) Date: Jun. 14, 2022

(87) PCT Pub. No.: WO2021/258715
PCT Pub. Date: Dec. 30, 2021

(65) Prior Publication Data
US 2023/0026877 A1    Jan. 26, 2023

(30) Foreign Application Priority Data
Jun. 22, 2020   (CN) .......................... 202010577773.1

(51) Int. Cl.
*H01Q 23/00*   (2006.01)
*G01R 29/10*   (2006.01)
*H04B 1/18*    (2006.01)

(52) U.S. Cl.
CPC ............. *H01Q 23/00* (2013.01); *G01R 29/10* (2013.01); *H04B 1/18* (2013.01)

(58) Field of Classification Search
CPC .......... H01Q 5/50; H01Q 1/243; H01Q 5/335; H01Q 9/0407; H01Q 9/42; H01Q 1/2241; H01Q 1/245; H01Q 5/328; H01Q 5/35
See application file for complete search history.

(56) References Cited

U.S. PATENT DOCUMENTS

| | | | | |
|---|---|---|---|---|
| 2013/0057232 A1* | 3/2013 | Chiu | ........................ | H04B 1/18 323/220 |
| 2018/0159220 A1* | 6/2018 | Kuroda | ..................... | H01Q 9/42 |
| 2022/0349839 A1* | 11/2022 | Liu | ........................... | G01D 5/24 |

FOREIGN PATENT DOCUMENTS

| | | |
|---|---|---|
| CN | 2899144 Y | 5/2007 |
| CN | 102983417 A | 3/2013 |

(Continued)

OTHER PUBLICATIONS

International Search Report for PCT/CN2020/142485 mailed on Mar. 18, 2021.

*Primary Examiner* — Wei (Victor) Y Chan
(74) *Attorney, Agent, or Firm* — The PL Law Group, PLLC

(57) ABSTRACT

A circuit includes an impedance tuning circuit, a first antenna tuning switch and a resistor. An antenna end of the first antenna tuning switch is electrically connected with an external antenna signal source. A control end of the first antenna tuning switch is electrically connected with an external controller. A first RF output end of the first antenna tuning switch is electrically connected with one end of the resistor, and the other end of the resistor and a second RF output end of the first antenna tuning switch are electrically connected with one end of the impedance tuning circuit. The other end of the impedance tuning circuit is electrically connected with the antenna. The external controller controls (Continued)

the antenna end to be connected with the first RF output end or the second RF output end according to an SAR test result of the antenna.

9 Claims, 4 Drawing Sheets

(56) References Cited

FOREIGN PATENT DOCUMENTS

| | | |
|---|---|---|
| CN | 106207375 A | 12/2016 |
| CN | 206098681 U | 4/2017 |
| CN | 107230825 A | 10/2017 |
| CN | 108832281 A | 11/2018 |
| CN | 209805817 U | 12/2019 |
| CN | 111682324 A | 9/2020 |
| JP | 2011-142484 A | 7/2011 |

* cited by examiner

CIRCUIT AND METHOD FOR REDUCING ANTENNA SAR

CROSS REFERENCE TO RELATED APPLICATIONS AND CLAIM OF PRIORITY

This application claims benefit under 35 U.S.C. 119, 120, 121, or 365(c), and is a National Stage entry from International Application No. PCT/CN2020/142485 filed on Dec. 31, 2020, which claims priority to the benefit of Chinese Patent Application No. 202010577773.1 filed in the Chinese Intellectual Property Office on Jun. 22, 2020, the entire contents of which are incorporated herein by reference.

BACKGROUND

1. Technical Field

The present application relates to the technical field of antennas, and more specifically, to a circuit and method for reducing antenna specific absorption rate (SAR).

2. Background of the Invention

Antennas will generate a certain amount of electromagnetic radiation during operation. The SAR (specific absorption rate) index is used worldwide to measure the energy absorbed by a human body in an electromagnetic exposure environment. SAR test is an item which antennas must go through, while the SAR test exceeding the standard is a common problem in existing antenna testing. There are two main methods for reducing antenna SAR in some cases. The first method is to change the maximum gain point of the antenna, disperse the maximum hot spot of antenna radiation or change the directivity of the hot spot of antenna radiation. Since the current adjustable gain of built-in antennas has been greatly changed, the first method is not easy to implement, and the research and development are difficult. The second method is to reduce the antenna conduction power. Since the requirements of 3GPP (3rd Generation Partnership Project) have set clear upper and lower limits for the target power, the operation of the second method is also limited. Therefore, these methods for reducing antenna SAR impose high requirements on wiring, cannot accurately suppress the power of the target band without affecting other frequency points, and have a low suppression precision.

SUMMARY

The technical problem to be solved by the present application is to provide a circuit and method for reducing antenna SAR, so as to remove the defects of high requirements on wiring and lower suppression precision of implementations for reducing antenna SAR.

The present application solves the foregoing technical problem through the following technical solutions:

The present application provides a circuit for reducing antenna SAR, which comprises an impedance tuning circuit. The circuit for reducing antenna SAR further comprises a first antenna tuning switch and a resistor. An antenna end of the first antenna tuning switch is electrically connected with an external antenna signal source. A control end of the first antenna tuning switch is electrically connected with an external controller. A first RF output end of the first antenna tuning switch is electrically connected with one end of the resistor, and the other end of the resistor and a second RF output end of the first antenna tuning switch are electrically connected with one end of the impedance tuning circuit. The other end of the impedance tuning circuit is electrically connected with the antenna. The external controller is used to control the antenna end of the first antenna tuning switch to be connected with the first RF output end when an SAR test result of the antenna exceeds the standard, and control the antenna end of the first antenna tuning switch to be connected with the second RF output end when the SAR test result of the antenna does not exceed the standard.

In an embodiment, the circuit for reducing antenna SAR further comprises a second antenna tuning switch and at least one RF filter circuit. The RF filter circuit is used to filter a preset frequency signal. An antenna end of the second antenna tuning switch is electrically connected with the antenna, and a control end of the second antenna tuning switch is electrically connected with the external controller. The RF filter circuit is electrically connected with any RF output end of the second antenna tuning switch. The external controller is used to control the second antenna tuning switch to turn on the RF filter circuit when the SAR test result of the antenna exceeds the standard.

In an embodiment, the circuit for reducing antenna SAR further comprises an antenna filter circuit. The antenna filter circuit is used to filter a signal input to the antenna. One end of the antenna filter circuit is electrically connected with the antenna end of the second antenna tuning switch, and the other end of the antenna filter circuit is grounded.

In an embodiment, the RF filter circuit comprises a first capacitor and a first inductor. One end of the first capacitor is grounded, and the other end of the first capacitor is electrically connected with one end of the first inductor and any RF output end of the second antenna tuning switch. The other end of the first inductor is grounded.

In an embodiment, the antenna filter circuit comprises a second inductor and a third inductor. One end of the second inductor is grounded, the other end of the second inductor is electrically connected with one end of the third inductor, and the other end of the third inductor is electrically connected with the antenna end of the second antenna tuning switch.

In an embodiment, the antenna filter circuit comprises a fourth inductor and a second capacitor. One end of the fourth inductor is grounded, the other end of the fourth inductor is electrically connected with one end of the second capacitor, and the other end of the second capacitor is electrically connected with the antenna end of the second antenna tuning switch.

In an embodiment, both the first antenna tuning switch and the second antenna tuning switch are integrated circuit chips.

In an embodiment, the model of the first antenna tuning switch is SP2T; the model of the second antenna tuning switch is SP4T.

The present application further provides a method for reducing antenna SAR, for use in a mobile terminal comprising a controller and an aforementioned circuit for reducing antenna SAR. The method for reducing antenna SAR comprises the steps of: obtaining an SAR test result of the antenna; judging whether the SAR test result exceeds the standard or not; if yes, the controller controlling the antenna end of the first antenna tuning switch to be connected with the first RF output end; and if not, the controller controlling the antenna end of the first antenna tuning switch to be connected with the second RF output end.

In an embodiment, the circuit for reducing antenna SAR further comprises a second antenna tuning switch and at least one RF filter circuit. An antenna end of the second antenna tuning switch is electrically connected with the antenna, and a control end of the second antenna tuning switch is electrically connected with the controller. The RF filter circuit is electrically connected with any RF output end of the second antenna tuning switch. After the step of controlling the antenna end of the first antenna tuning switch to be connected with the first RF output end, the method for reducing antenna SAR further comprises: the controller controlling the second antenna tuning switch to turn on the RF filter circuit.

The present application has the following positive progressive effects: by adding the first antenna tuning switch and the resistor at the impedance tuning circuit to divide the voltage, the power at the frequency point may be reduced, the power radiation may be suppressed, and the purpose of reducing antenna SAR may be achieved. Further, by adding the RF filter circuit at the antenna tuning switch, a specific frequency point may be filtered, requirements on wiring adjustment are low, and the power of a target band may be precisely suppressed without other frequency points being affected. Moreover, by adding the antenna filter circuit, the whole band may be filtered, and the purpose of reducing SAR may be fulfilled.

DETAILED DESCRIPTION

The present application will be further illustrated through Examples below. However, the present application is not intended to be limited to the scope of the Examples.

Example 1

Figure 1:
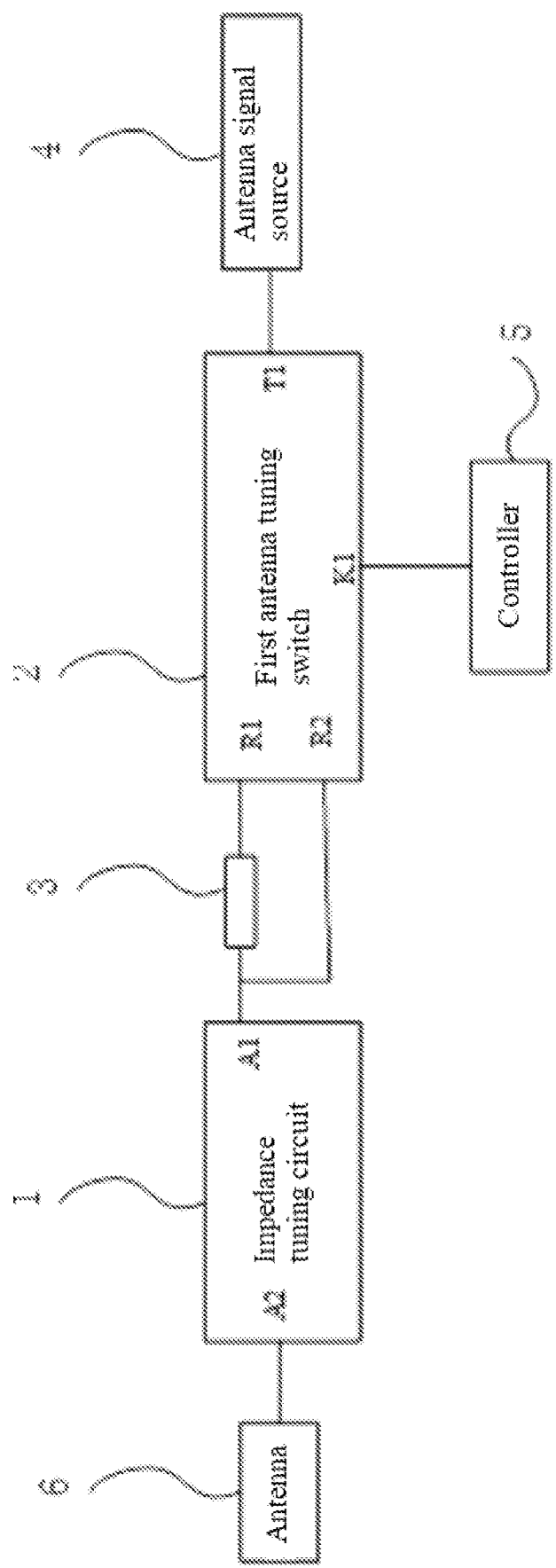
FIG. 1 shows a structural schematic view of a circuit for reducing antenna SAR according to Example 1 of the present application.

The present Example provides a circuit for reducing antenna SAR. With reference to FIG. 1, the circuit for reducing antenna SAR according to the present Example comprises an impedance tuning circuit 1, a first antenna tuning switch 2 and a resistor 3. An antenna end T1 of the first antenna tuning switch 2 is electrically with an external antenna signal source 4. A control end K1 of the first antenna tuning switch 2 is electrically connected with an external controller 5. A first RF output end R1 of the first antenna tuning switch 2 is electrically connected with one end of the resistor 3, and the other end of the resistor 3 and a second RF output end R2 of the first antenna tuning switch 2 are electrically connected with one end A1 of the impedance tuning circuit 1. The other end A2 of the impedance tuning circuit 1 is electrically connected with an antenna 6. The external controller 5 is used to control the antenna end T1 of the first antenna tuning switch 2 to be connected with the first RF output end R1 when an SAR test result of the antenna 6 exceeds the standard, and control the antenna end T1 of the first antenna tuning switch 2 to be connected with the second RF output end R2 when the SAR test result of the antenna 6 does not exceed the standard.

By adding the first antenna tuning switch 2 and the resistor 3 at the impedance tuning circuit 1 to divide the voltage, the circuit for reducing antenna SAR according to the present Example can reduce the power at the frequency point, suppress the power radiation, and achieve the purpose of reducing antenna SAR.

Example 2

The present Example is further improved on the basis of the circuit for reducing antenna SAR in Example 1, and provides a circuit for reducing antenna SAR.

Figure 2:
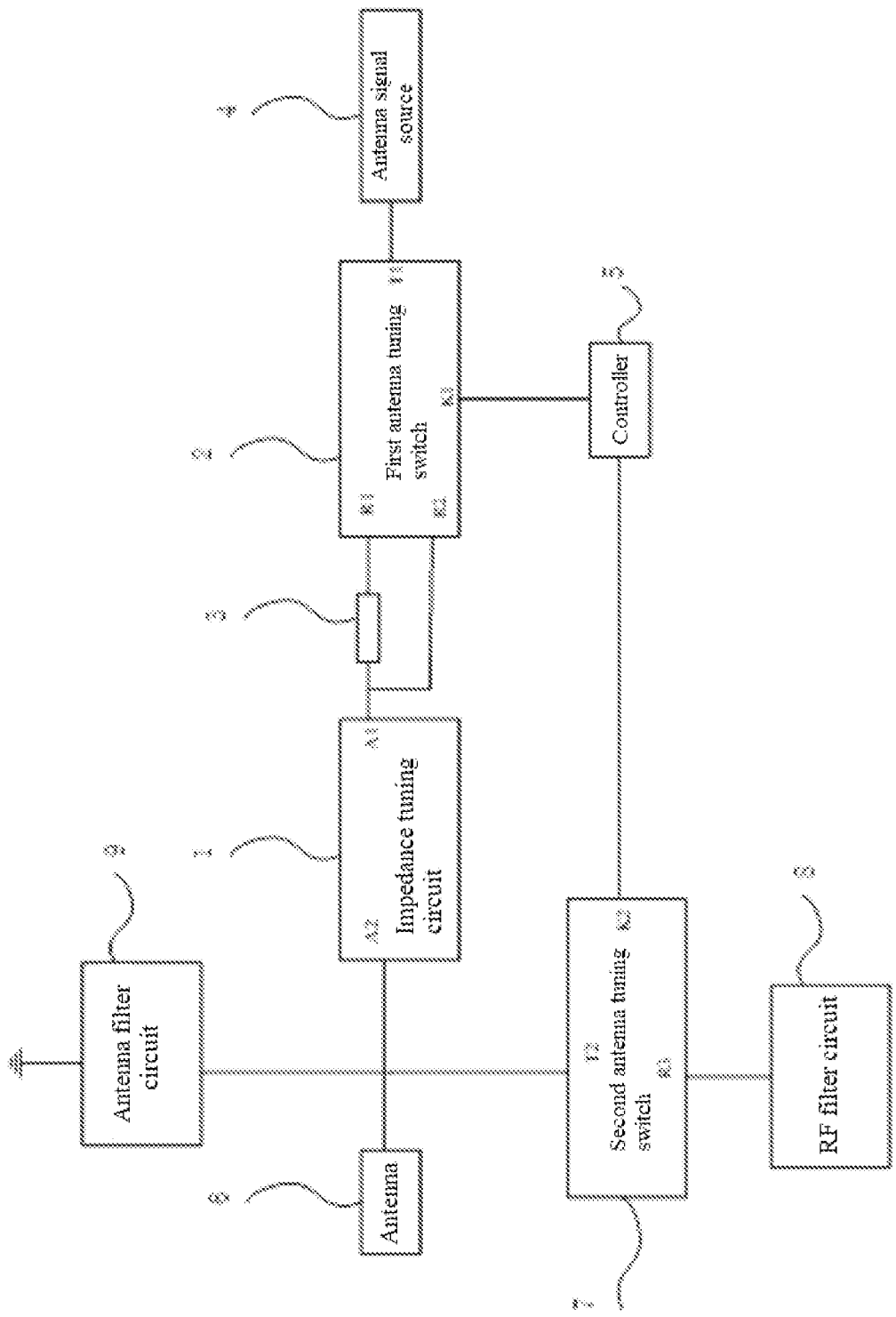
FIG. 2 shows a structural schematic view of a circuit for reducing antenna SAR according to Example 2 of the present application.

With reference to FIG. 2, based on Example 1, the circuit for reducing antenna SAR according to the present Example further comprises a second antenna tuning switch 7 and at least one RF filter circuit 8. The RF filter circuit 8 is used to filter a preset frequency signal. An antenna end T2 of the second antenna tuning switch 7 is electrically connected with the antenna 6, and a control end K2 of the second antenna tuning switch 7 is electrically connected with the external controller 5. The RF filter circuit 8 is electrically connected with any RF output end of the second antenna tuning switch 7, and is electrically connected with an RF output end R3 of the second antenna tuning switch 7 in the present Example. The external controller 5 is used to control the second antenna tuning switch 7 to turn on the RF filter circuit 8 when an SAR test result of the antenna 6 exceeds the standard.

The circuit for reducing antenna SAR according to the present Example further comprises an antenna filter circuit 9. The antenna filter circuit 9 is used to filter a signal which is input to the antenna 6. One end of the antenna filter circuit 9 is electrically connected with the antenna 6, and the other end thereof is grounded.

Figure 3:
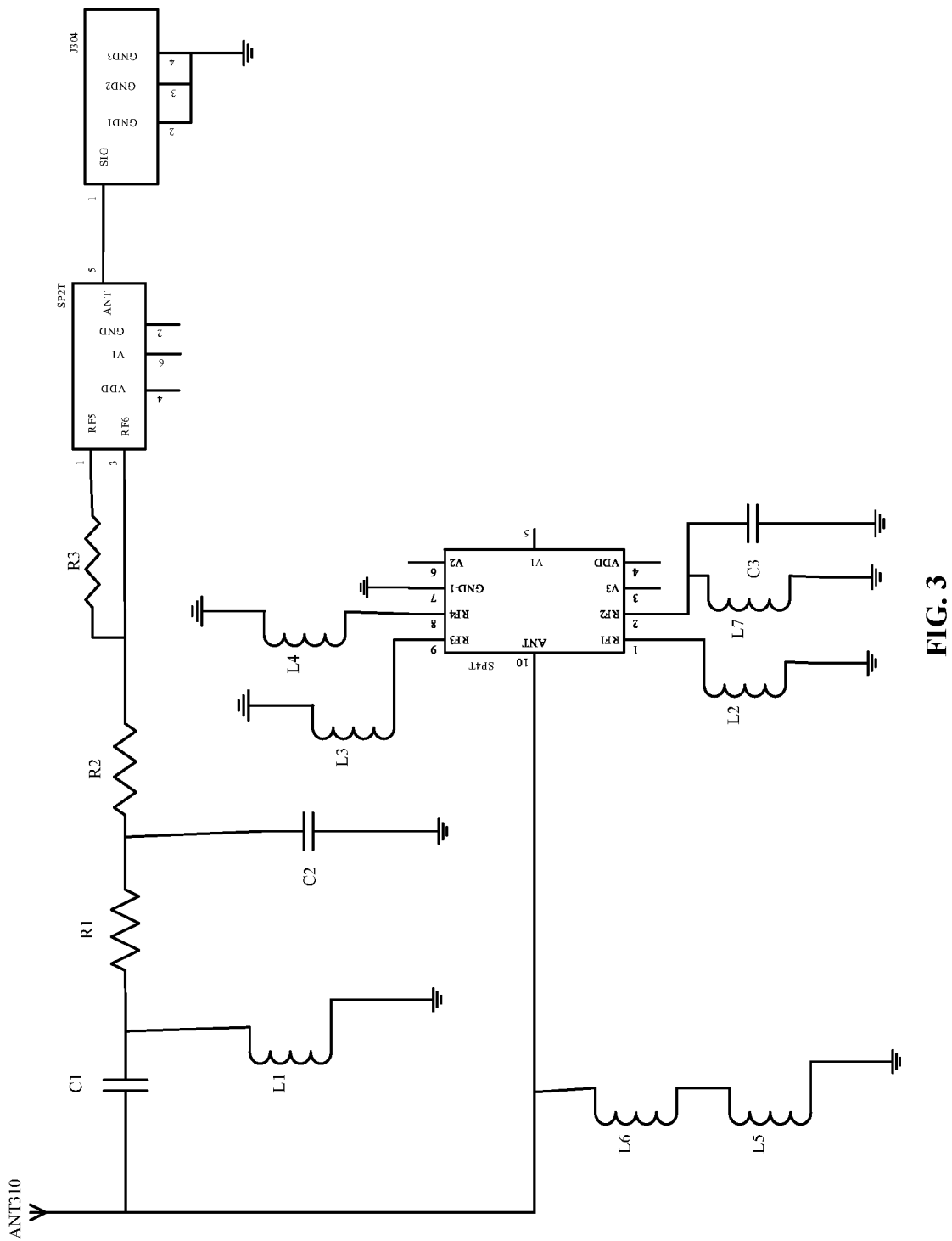
FIG. 3 shows a diagram of a circuit for reducing antenna SAR according to Example 2 of the present application.

Reference is made to FIG. 3, which shows a schematic view of specific circuit implementation of a circuit for reducing antenna SAR in the present Example.

Both the first antenna tuning switch 2 and the second antenna tuning switch 7 are integrated circuit chips. The model of the first antenna tuning switch 2 is SP2T, and the model of the second antenna tuning switch 7 is SP4T. SP4T comprises four RF output ends, i.e., RF1, RF2, RF3 and RF4, respectively.

The model of the antenna 6 is ANT 310. The impedance tuning circuit 1 comprises a capacitor C1, a capacitor C2, a resistor R1, a resistor R2 and an inductor L1.

One end of the resistor C1 is electrically connected with an input end of ANT310, and the other end of the resistor C1 is electrically connected with the resistor R1. The other end of the resistor R1 is electrically connected with the resistor R2. The other end of the resistor R2 is electrically connected with one end of the resistor R3 and a second RF output end RF6 of SP2T. One end of the inductor L1 is electrically connected with a connection point of the capacitor C1 and the resistor R1. The other end of the inductor L1 is grounded. One end of the capacitor C2 is electrically connected with a connection point of the resistor R1 and the resistor R2, and the other end thereof is grounded.

An antenna end ANT of SP2T is electrically connected with a SIG end of an external antenna signal source J304.

A control end V1 of SP2T is electrically connected with the external controller.

A first RF output end RF5 of SP2T is electrically connected with the other end of the resistor R3.

The external controller is used to control the antenna end ANT of SP2T to be connected with the first RF output end RF5 of SP2T when an SAR test result of ANT310 exceeds the standard, and control the antenna end ANT of SP2T to be connected with the second RF output end RF6 of SP2T when the SAR test result of ANT310 does not exceed the standard.

The RF filter circuit 8 comprises a capacitor C3 and an inductor L7. One end of the capacitor C3 is electrically connected with one end of the inductor L7 and the second RF output end RF2 of SP4T. The other end of the capacitor C3 and the other end of the inductor L7 are both grounded.

An antenna end ANT of SP4T is electrically connected with an input end of ANT310. The first RF output end RF1 of SP4T is connected in series with an inductor L2 to the ground, the third RF output end RF3 of SP4T is connected in series with an inductor L3 to the ground, and the fourth RF output end RF4 of SP4T is connected in series with an inductor L4 to the ground. The control ends V1, V2 and V3 of SP4T are all electrically connected with the external controller. The controller outputs a 3-bit binary code to control the antenna end ANT of SP4T to be connected with one of the four RF output ends.

The external controller is further used to control SP4T to turn on the RF filter circuit 8 when an SAR test result of ANT310 exceeds the standard, so as to reduce a frequency point corresponding to the RF filter circuit 8 for filtering and achieve the purpose of reducing antenna SAR. The circuit for reducing antenna SAR according to the present Example imposes lower requirements on wiring adjustment and can precisely suppress the power of the target band without affecting other frequency points.

There may be a plurality of RF filter circuits 8 in the present Example. The RF filter circuit 8 may be connected with any RF output end of SP4T. By outputting different codes by the external controller, different RF output ends of SP4T may be selected to be connected with the antenna end, the power of multiple bands may be precisely suppressed without other frequency points being affected, and the purpose of reducing antenna SAR may be achieved.

The antenna filter circuit 9 in the present embodiment comprises an inductor L5 and an inductor L6. One end of the inductor L5 is grounded, and the other end thereof is connected with one end of the inductor L6, while the other end of the inductor L6 is connected with ANT310.

The antenna filter circuit 9 is used to filter all signals input to ANT310, suppress the power radiation and achieve the purpose of reducing SAR.

In other alternative embodiments, the antenna filter circuit 9 may further comprise an inductor and a capacitor. The way of connection between the inductor and the capacitor is similar to that between the inductor L5 and the inductor L6, which is not detailed here.

By adding the RF filter circuit at the antenna tuning switch, the circuit for reducing antenna SAR according to the present Example can filter specific frequency points, imposes lower requirements on wiring adjustment and can precisely suppress the power of the target band without affecting other frequency points. Meanwhile, by adding the antenna filter circuit, it is possible to filter the whole band and achieve the purpose of reducing SAR.

Example 3

The present Example implements a method for reducing antenna SAR, which is used in a mobile terminal comprising a controller and a circuit for reducing antenna SAR in Example 2.

Figure 4:
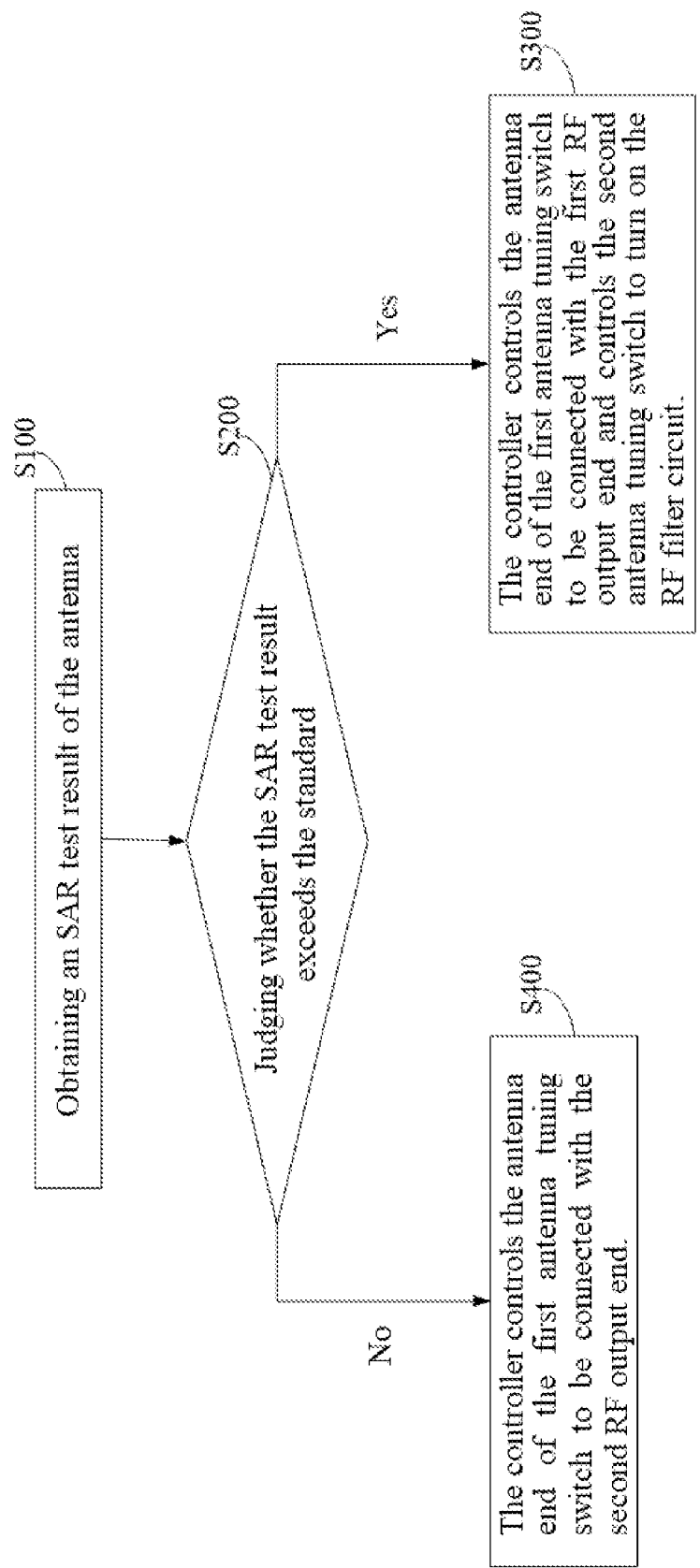
FIG. 4 shows a flowchart of a method for reducing antenna SAR according to Example 3 of the present application.

With reference to FIG. 4, the method for reducing antenna SAR according to the present Example comprises the following steps:

S100, obtaining an SAR test result of the antenna;

S200, judging whether the SAR test result exceeds the standard or not;

If yes, performing step S300; otherwise, performing step S400;

S300, the controller controls the antenna end of the first antenna tuning switch to be connected with the first RF output end and controls the second antenna tuning switch to turn on the RF filter circuit, and then the workflow ends;

S400, the controller controls the antenna end of the first antenna tuning switch to be connected with the second RF output end, and then the workflow ends.

With the method for reducing antenna SAR according to the present Example, when the antenna SAR test result exceeds the standard, the antenna end of the first antenna tuning switch is controlled to be connected with the first RF output end, and the second antenna tuning switch is controlled to turn on the RF filter circuit, so that a specific frequency point can be filtered. Furthermore, requirements on wiring adjustment are low, the power of a target band may be precisely suppressed without other frequency points being affected, the entire band may be filtered, and the purpose of reducing SAR may be achieved.

Although specific embodiments of the present application have been described above, those skilled in the art should understand that this is merely for illustration, and the protection scope of the present application is defined by the appended claims. Those skilled in the art may make various changes or modifications to these embodiments without departing from the principles and essence of the present application, and all of these changes and modifications fall within the protection scope of the present application.

What is claimed is:

1. A circuit for reducing antenna specific absorption rate (SAR), the circuit comprising:
an impedance tuning circuit;
a first antenna tuning switch; and
a resistor,
wherein an antenna end of the first antenna tuning switch is electrically connected with an external antenna signal source;
a control end of the first antenna tuning switch is electrically connected with an external controller;
a first radio frequency (RF) output end of the first antenna tuning switch is electrically connected with one end of the resistor, and the other end of the resistor and a second RF output end of the first antenna tuning switch are electrically connected with one end of the impedance tuning circuit;
the other end of the impedance tuning circuit is electrically connected with the antenna; and
the external controller is configured to control the antenna end of the first antenna tuning switch to be connected with the first RF output end when an SAR test result of the antenna exceeds the standard, and control the antenna end of the first antenna tuning switch to be connected with the second RF output end when the SAR test result of the antenna does not exceed the standard,
wherein the circuit for reducing antenna SAR further comprises a second antenna tuning switch and at least one RF filter circuit;

the RF filter circuit is used to filter a preset frequency signal;

an antenna end of the second antenna tuning switch is electrically connected with the antenna, and a control end of the second antenna tuning switch is electrically connected with the external controller;

the RF filter circuit is electrically connected with any RF output end of the second antenna tuning switch; and the external controller is used to control the second antenna tuning switch to turn on the RF filter circuit when the SAR test result of the antenna exceeds the standard.

2. The circuit of claim 1, further comprising an antenna filter circuit, wherein the antenna filter circuit is configured to filter a signal input to the antenna; and one end of the antenna filter circuit is electrically connected with the antenna end of the second antenna tuning switch, and the other end of the antenna filter circuit is grounded.

3. The circuit of claim 1, wherein the RF filter circuit comprises a first capacitor and a first inductor;

one end of the first capacitor is grounded, the other end of the first capacitor is electrically connected with one end of the first inductor and any RF output end of the second antenna tuning switch; and the other end of the first inductor is grounded.

4. The circuit of claim 2, wherein the antenna filter circuit comprises a second inductor and a third inductor; and one end of the second inductor is grounded, the other end of the second inductor is electrically connected with one end of the third inductor, and the other end of the third inductor is electrically connected with the antenna end of the second antenna tuning switch.

5. The circuit of claim 2, wherein the antenna filter circuit comprises a fourth inductor and a second capacitor; and one end of the fourth inductor is grounded, the other end of the fourth inductor is electrically connected with one end of the second capacitor, and the other end of the second capacitor is electrically connected with the antenna end of the second antenna tuning switch.

6. The circuit of claim 1, wherein both the first antenna tuning switch and the second antenna tuning switch are integrated circuit chips.

7. The circuit of claim 6, wherein the model of the first antenna tuning switch is single pole double throw (SP2T); and the model of the second antenna tuning switch is single pole four throuw (SP4T).

8. A method for reducing antenna SAR, for use in a mobile terminal, wherein the mobile terminal comprises a controller and the circuit of claim 1, the method comprising:

obtaining an SAR test result of the antenna;

judging whether the SAR test result exceeds the standard or not;

if the SAR test result exceeds the standard, the controller controlling the antenna end of the first antenna tuning switch to be connected with the first RF output end; and if the SAR test result does not exceed the standard, the controller controlling the antenna end of the first antenna tuning switch to be connected with the second RF output end.

9. The method of claim 8, wherein the circuit further comprises a second antenna tuning switch and at least one RF filter circuit;

an antenna end of the second antenna tuning switch is electrically connected with the antenna, a control end of the second antenna tuning switch is electrically connected with the controller;

the RF filter circuit is electrically connected with any RF output end of the second antenna tuning switch; and after the step of controlling the antenna end of the first antenna tuning switch to be connected with the first RF output end, the method for reducing antenna SAR further comprises:

the controller controlling the second antenna tuning switch to turn on the RF filter circuit.

* * * * *